United States Patent
Sung et al.

(10) Patent No.: US 10,218,293 B2
(45) Date of Patent: Feb. 26, 2019

(54) PIEZOELECTRIC HARVESTING SYSTEM USING REPULSION FORCE

(71) Applicant: AMC ENERGY CO., LTD., Seongdong-gu, Seoul (KR)

(72) Inventors: Tae Hyun Sung, Seoul (KR); Hyun Jun Jung, Seoul (KR); Ki Hwan Baek, Seoul (KR); Daniel Song, Seoul (KR); Chan Ho Yang, Seoul (KR)

(73) Assignee: AMC ENERGY CO., LTD., Seongdong-gu, Seoul (KR)

( * ) Notice: Subject to any disclaimer, the term of this patent is extended or adjusted under 35 U.S.C. 154(b) by 406 days.

(21) Appl. No.: 14/912,215

(22) PCT Filed: Aug. 16, 2013

(86) PCT No.: PCT/KR2013/007404
§ 371 (c)(1),
(2) Date: Apr. 19, 2016

(87) PCT Pub. No.: WO2015/023018
PCT Pub. Date: Feb. 19, 2015

(65) Prior Publication Data
US 2016/0254762 A1    Sep. 1, 2016

(51) Int. Cl.
*H01L 41/113* (2006.01)
*H02N 2/18* (2006.01)

(52) U.S. Cl.
CPC ......... *H02N 2/186* (2013.01); *H01L 41/1136* (2013.01); *H02N 2/18* (2013.01)

(58) Field of Classification Search
CPC ....... H02N 2/186; H02N 2/18; H01L 41/1136
(Continued)

(56) References Cited

U.S. PATENT DOCUMENTS 7,633,175 B1 *  12/2009  Wilson, III ............. F01D 9/041
                                                          290/43
8,174,168 B2 *  5/2012   Nakamura .......... B60C 23/0411
                                                          310/339
(Continued)

FOREIGN PATENT DOCUMENTS

EP          2262094        12/2012
JP      2001157433 A       6/2001
(Continued)

OTHER PUBLICATIONS

International Search Report dated May 16, 2014 from corresponding PCT International Application No. PCT/KR2013/007404, 4 pages.
(Continued)

*Primary Examiner* — Thomas Dougherty
(74) *Attorney, Agent, or Firm* — Innovation Capital Law Group, LLP; Vic Lin

(57) ABSTRACT

A piezoelectric harvesting system using repulsion force, according to one embodiment of the present invention, comprises: a piezoelectric body comprising a piezoelectric material; a fixed portion to at least one surface of which the piezoelectric body is adhered; a support portion for supporting one side of the fixed portion; and a repulsion force-providing portion for providing repulsion force to the fixed portion, so that the piezoelectric body generates electric energy when the fixed portion is deformed due to application of external force and then recovered. According to one embodiment of the present invention, additional shock is applied to the fixed portion to which the piezoelectric body is adhered when recovering after being deformed, thereby increasing the amount of electric energy generated due to the deformation of the piezoelectric body.

15 Claims, 4 Drawing Sheets

(58) Field of Classification Search
USPC .......................................................... 310/339
See application file for complete search history.

(56) References Cited

U.S. PATENT DOCUMENTS

| | | | | |
|---|---|---|---|---|
| 9,479,089 | B2* | 10/2016 | Andosca | .................... F03G 7/08 |
| 9,728,707 | B2* | 8/2017 | Vaeth | .................. H01L 41/1136 |
| 2008/0277941 | A1* | 11/2008 | Bowles | ............... E21B 41/0085 |
| | | | | 290/54 |
| 2009/0211353 | A1* | 8/2009 | Gao | .................... B60C 23/0411 |
| | | | | 73/146.5 |
| 2009/0315335 | A1* | 12/2009 | Ujihara | ................... F03G 7/065 |
| | | | | 290/1 R |
| 2009/0315431 | A1 | 12/2009 | Rastegar | |
| 2012/0240672 | A1* | 9/2012 | Frey | ...................... H01L 41/053 |
| | | | | 73/146.5 |
| 2012/0267982 | A1* | 10/2012 | Carman | ................. H02N 2/186 |
| | | | | 310/318 |
| 2013/0088123 | A1* | 4/2013 | Haskett | ................. H01L 41/053 |
| | | | | 310/329 |

FOREIGN PATENT DOCUMENTS

| | | |
|---|---|---|
| JP | 2003218418 A | 7/2003 |
| KR | 100988077 | 10/2010 |
| KR | 20110056796 A | 5/2011 |
| KR | 20130016084 | 2/2013 |
| KR | 20130105240 A | 9/2013 |

OTHER PUBLICATIONS

Korean Office Action dated May 25, 2013 from related Korean Application No. KR10-2012-0083972, 4 pages.
Written Opinion dated May 16, 2014 from corresponding PCT International Application No. PCT/KR2013/007404, 5 pages.

* cited by examiner

[Fig. 1]
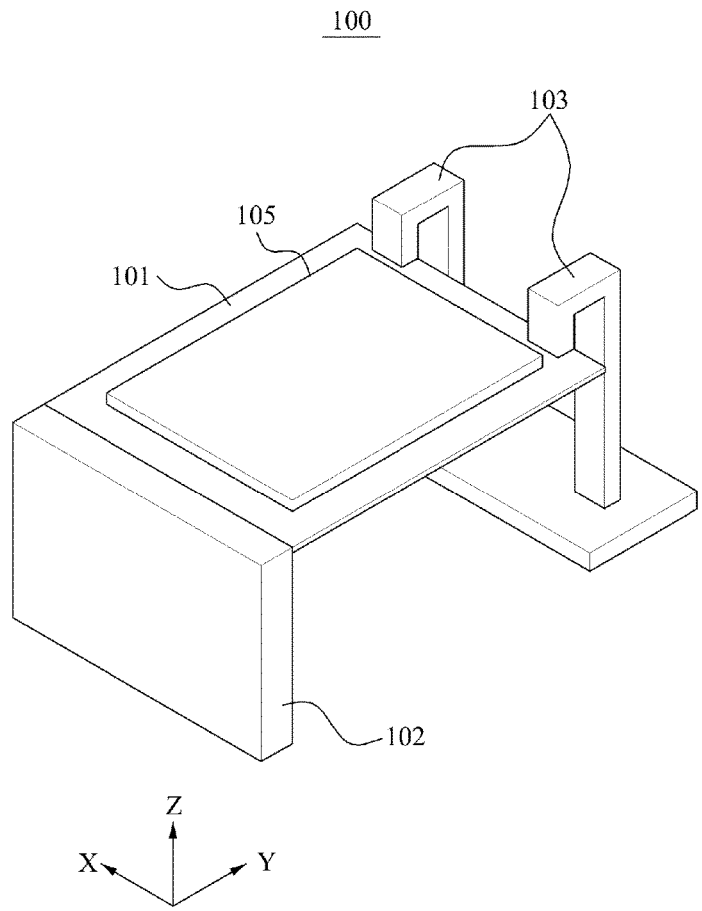
[Fig. 2]
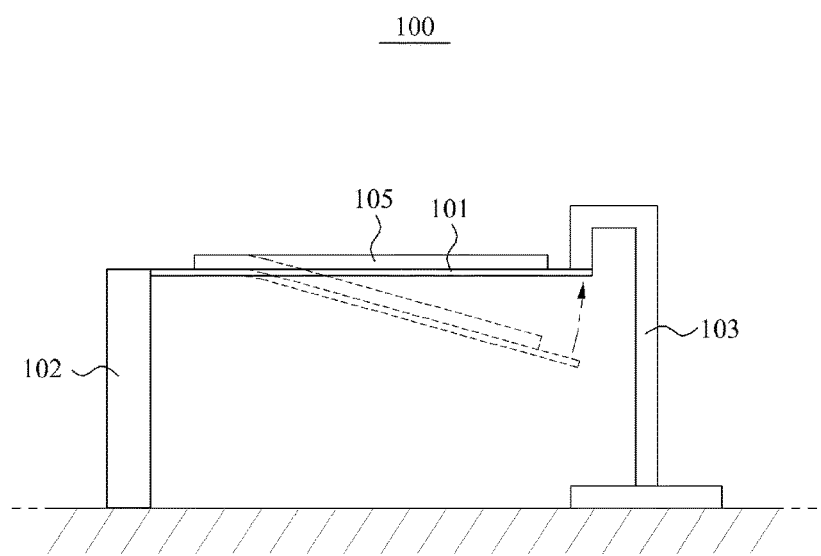

[Fig. 3]
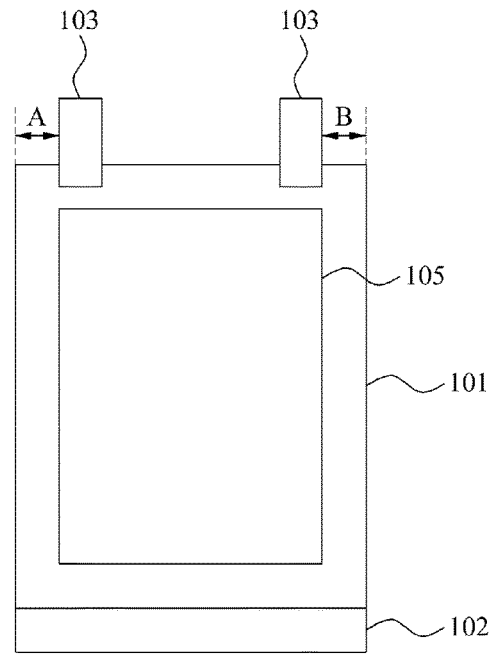
[Fig. 4]
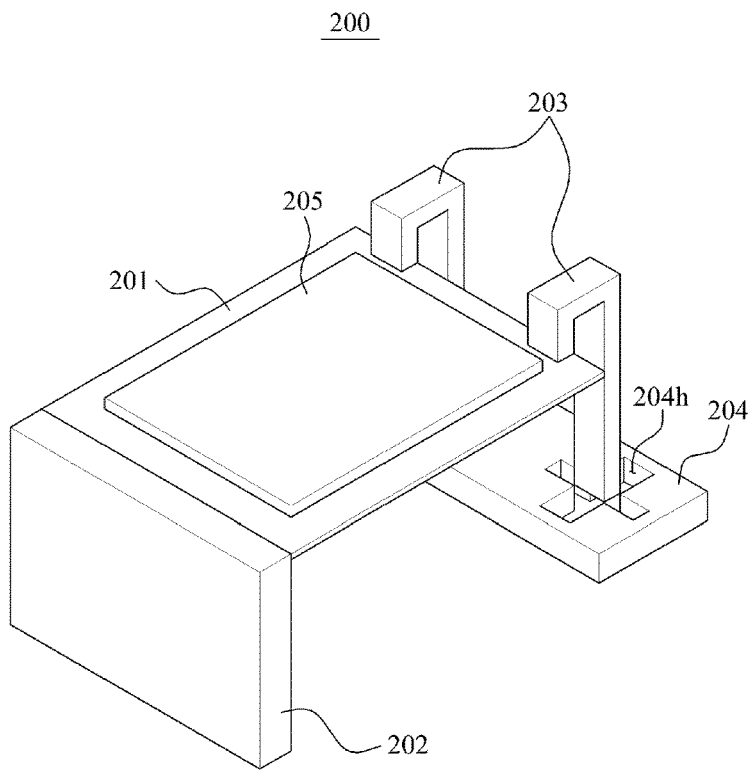

[Fig. 5]
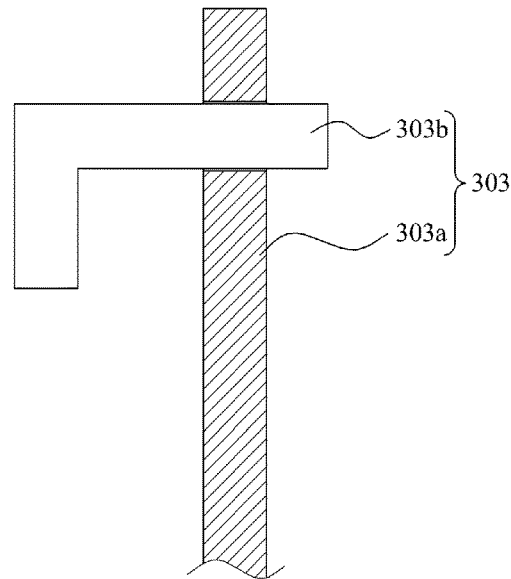
[Fig. 6]
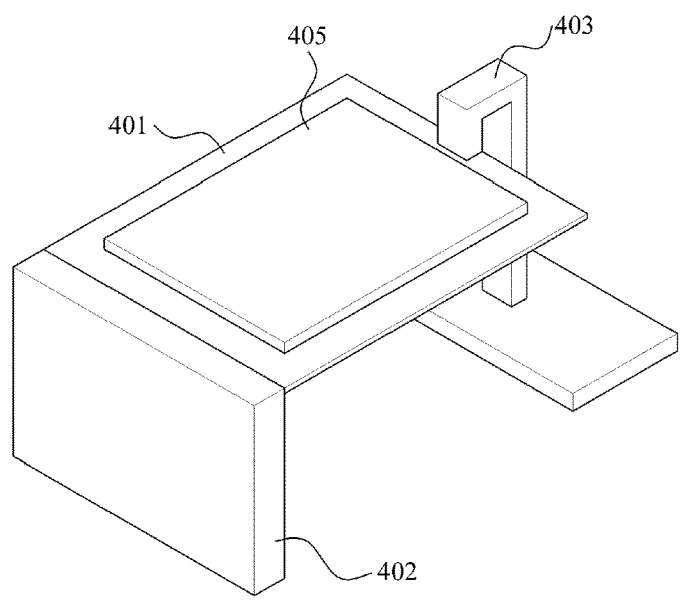

[Fig. 7]
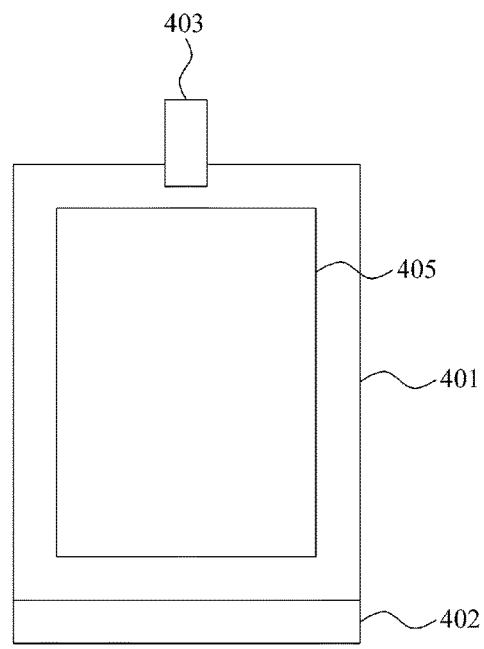
[Fig. 8]
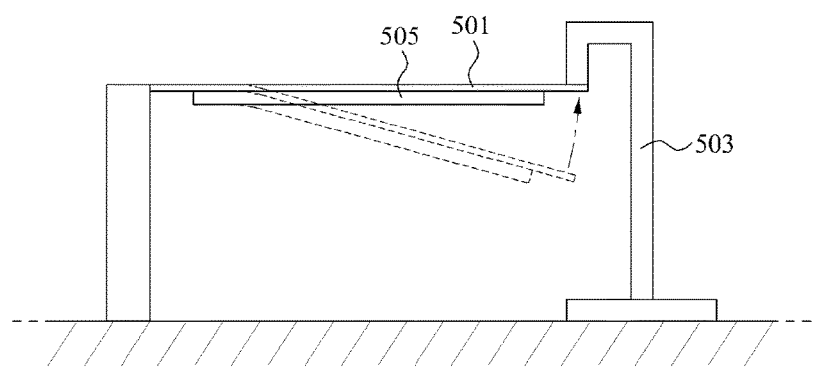

PIEZOELECTRIC HARVESTING SYSTEM USING REPULSION FORCE

TECHNICAL FIELD

The present invention relates to a piezoelectric harvesting system using a repulsion force, and more particularly, to a piezoelectric harvesting system using a repulsion force to increase an amount of electrical energy generated through a deformation of a piezoelectric body by applying an additional impact using the repulsion force provider in a process of restoring a fixer on which the piezoelectric body is attached from a deformed state.

BACKGROUND ART

Recently, natural energy consumption has been steadily increasing, an amount of energy generation has been also increasing, and thus a capacity for energy developing system has been correspondingly increasing. In general, in cases of new regeneration energy development, sunlight generation, and wind power generation, energy generation may be instable due to an unpredictability of a natural energy source and an energy development system may need to be constructed in a rural area. For this reason, there is a desire for a new development system.

To solve this, a superconductivity development system has been suggested as various types of distributed power sources. However, a piezoelectric development system has been developed in terms of efficiency on new regeneration energy development.

Among various types of new regeneration energy, research on a piezoelectric energy harvesting that uses a relatively minuscule energy as the regeneration energy is being conducted and interests in an industrialization of the piezoelectric energy harvesting is also increasing. In particular, research on a piezoelectric harvesting system is being actively conducted to increase electrical energy generation efficiency.

DISCLOSURE OF INVENTION

Technical Goals

An aspect of the present invention provides a piezoelectric harvesting system using a repulsion force to increase an amount of electrical energy generated through a deformation of a piezoelectric body by applying an additional impact using the repulsion force provider in a process of restoring a fixer on which the piezoelectric body is attached from a deformed state.

Another aspect of the present invention also provides a piezoelectric harvesting system to increase an energy generation rate and a number of impacts by applying an additional impact to a fixer on which the piezoelectric body is attached using a repulsion force of a repulsion force provider.

Technical Solutions

According to an aspect of the present invention, there is provided a piezoelectric harvesting system using a repulsion force, the system including a piezoelectric body including a piezoelectric material, a fixer having at least one face on which the piezoelectric body is attached, a supporter configured to support one side of the fixer, and a repulsion force provider configured to allow the piezoelectric body to generate an electrical energy by providing a repulsion force to the fixer in a process of restoring the fixer deformed by an external force.

The repulsion force provider may be configured to be in contact with a portion of another face on which the piezoelectric body is not attached.

When the external force is not applied to the fixer, a height of the portion of the other face may correspond to a height of one end portion of the repulsion force provider.

A pair of repulsion force providers may be provided to provide the repulsion force to symmetrical points of the fixer.

The system may further include a connecting plate configured to horizontally adjust a position of the repulsion force provider, wherein the connecting plate may include a moving groove formed in a cross shape and configured to accept a portion of a lower end of the repulsion force provider such that the repulsion force provider moves in one direction and a direction perpendicular to the one direction.

The repulsion force provider may include a fixing bar provided in a longitudinal direction, and a moving member adjustably attached to the fixing bar in the longitudinal direction and configured to adjust a strength of the repulsion force applied to the fixer.

The piezoelectric body may be attached to a top of the fixer such that a tensile force is exerted on the piezoelectric body when the external force is applied to the fixer in a downward direction.

The piezoelectric body may be attached to a bottom of the fixer such that a compressive force is exerted on the piezoelectric body when the external force is applied to the fixer in a downward direction.

According to another aspect of the present invention, there is also provided piezoelectric harvesting system using a repulsion force, the system including a piezoelectric body including a piezoelectric material, a fixer on which the piezoelectric body is attached, a supporter configured to support one side of the fixer, and a repulsion force provider configured to hit the fixer in a process of restoring the fixer deformed by an external force. The system may further include a hitting member configured to provide the external force based on a flow of a fluid, wherein the repulsion force provider may be configured to hit the fixer being restored in a fixed state.

Effects

According to an embodiment of the present invention, it is possible to increase an amount of electrical energy generated through a deformation of a piezoelectric body by applying an additional impact using the repulsion force provider in a process of restoring a fixer on which the piezoelectric body is attached from a deformed state.

According to another embodiment of the present invention, it is possible to increase an energy generation rate and a number of impacts by applying an additional impact to a fixer on which the piezoelectric body is attached using a repulsion force of a repulsion force provider.

BRIEF DESCRIPTION OF DRAWINGS

FIG. 1 is a perspective view illustrating a piezoelectric harvesting system according to a first embodiment of the present invention.

FIG. 2 is a frontal view of FIG. 1.

FIG. 3 is a top view of FIG. 1.

FIG. 4 is a perspective view illustrating a piezoelectric harvesting system according to a second embodiment of the present invention.

FIG. 5 illustrates a repulsion force provider moving in a piezoelectric harvesting system according to a third embodiment of the present invention.

FIG. 6 is a perspective view illustrating a piezoelectric harvesting system according to a fourth embodiment of the present invention.

FIG. 7 is a top view of FIG. 6.

FIG. 8 illustrates a piezoelectric harvesting system according to a fifth embodiment of the present invention.

BEST MODE FOR CARRYING OUT THE INVENTION

Hereinafter, example embodiments are described below in order to explain the present invention by referring to the figures. The embodiments are provided as one of various aspects within the scope of the claims of the prevent invention, and the following descriptions are considered to be a part of the detailed description of the present invention.

Also, in the description of embodiments, detailed description of well-known related structures or functions will be omitted when it is deemed that such description will cause ambiguous interpretation of the present invention.

FIG. 1 is a perspective view illustrating a piezoelectric harvesting system according to a first embodiment of the present invention. FIG. 2 is a frontal view of FIG. 1. FIG. 3 is a top view of FIG. 1.

As illustrated in the drawings, according to the first embodiment of the present invention, a piezoelectric harvesting system 100 using a repulsion force may include a piezoelectric body 105 formed of a piezoelectric material, a fixer 101 on which the piezoelectric body 105 is attached, a supporter 102 configured to support the fixer 101 based on a cantilever type, and a repulsion force provider 103 configured to provide a repulsion force to the piezoelectric body 105.

Referring to FIG. 1, the piezoelectric body 105 may be attached on a top of the fixer 101 formed in a quadrangle plate. When the fixer 101 is hit and a tensile force is applied to the fixer 101, the tensile force may also be applied to the piezoelectric body 105. When a compressive force is applied in a process of restoring the fixer 101, the compressive force may also be applied to the piezoelectric body 105 and an electrical energy may be generated. The fixer 101 may be elastically deformed by an external force and restored to be in an original state. The piezoelectric harvesting system 100 may also include a hitting member (not shown) configured to provide an external force based on a flow of a fluid. When the hitting member hits the fixer 101, the piezoelectric body 105 may be deformed.

Although the present embodiment describes an example in which the piezoelectric body 105 is attached on the top of the fixer 101, the present disclosure is not limited thereto. Thus, the piezoelectric body 105 may also be attached on a bottom of the fixer 101 or attached on both top and bottom of the fixer 101.

Additionally, the piezoelectric body 105 may basically use a ceramic piezoelectric element having a high generation rate, a polymer piezoelectric element having a high physical flexibility, and a hybrid piezoelectric element formed of polymer and ceramic materials. Thus, the piezoelectric body 105 may have a relatively high durability based on the physical flexibility and also ensure a relatively high generation rate.

In general, a piezoelectric element of the piezoelectric body 105 may be formed with polyvinylidene fluoride (PVDF) and also include barium titanate, a lead zirconate titanate (PZT) crystal, or a PZT fiber. The piezoelectric element may include, for example, a lead-free piezoelectric material such as NKN-based material, a BZT-BCT based material, a BNT-based material, a BSNN material, a BNBN-based material, and the like. The piezoelectric element may also include, for example, lead lanthanum zirconium titanate (PLZT), poly(vinylidenefluoride-co-trifluoroethylene (P(VDF-TrFE)), a crystal, a tourmaline, a Rochelle salt, barium titanate, monoammonium phosphate, and Ethylenediamine tartrate.

A type and a material of the piezoelectric body 105 is not limited to the foregoing and thus, any material ensuring a sufficient generation rate based on an external force is also applicable. Electrical energy may be generated when a first impact is applied to the fixer 101 on which the piezoelectric body 105 is attached. Also, the electrical energy may be additionally generated by an external force applied secondarily when the fixer 101 is restored from a deformed state and receives a repulsion force from the repulsion force provider 103.

In an existing piezoelectric harvesting system, a restoring force (the repulsion force) of a deformed piezoelectric body may not be used. In the piezoelectric harvesting system 100 of the present embodiment, an additional impact may be applied to the fixer 101 on which the piezoelectric body 105 is attached using the repulsion force.

Since an impact based on the repulsion force is additionally applied as well as an impact based on an acquired energy source, the number of impacts per unit time may increase and thus, a generation rate may also increase.

A structure installed to trigger the impact based on the repulsion force, that is, the repulsion force provider 103 may be fixed to, for example, a ground not to be movable by the external force. Also, one end portion of the repulsion force provider 103 may partially contact one area of the fixer 101, that is, a portion of another side of the fixer 101 on which the piezoelectric body 105 is not attached. Through this, an amount of impact per unit time may increase. Accordingly, a generation rate higher than an instant generation rate of the first impact may be acquired.

Referring to FIGS. 1 through 3, in the piezoelectric harvesting system 100, the repulsion force provider 103 may apply an additional impact to the fixer 101 after the first impact of a power source (not shown) of the fixer 101 and before a subsequent impact is applied thereto. Through thus, the number of impacts per unit time may increase and thus, the generation rate may also increase when compared to the conventional system.

Referring to FIG. 3, in the piezoelectric harvesting system 100, a pair of the repulsion force providers 103 may also be hit when hitting the fixer 101 to apply the first impact.

Also, to evenly deliver power to the fixer 101, a position of the repulsion force provider 103 may be adjusted such that A and B that is a space in both sides of the repulsion force provider 103 are to be the same as each other. Through this, the power may be evenly delivered to the fixer 101 and the piezoelectric body 105 may receive the delivered power, thereby preventing damage on the piezoelectric body 105, which may occur when power is excessively concentrated on a predetermined portion of the piezoelectric body 105.

Also, referring to FIG. 2, when the external force is not applied to the fixer 101, a height of the portion of the other side on the fixer 101 may correspond to a height of the one end portion of the repulsion force provider 103. Thus, when the external force is not applied, the fixer 101 may maintain a horizontality. When the external force is not applied, the fixer 101 and the piezoelectric body 105 attached on the fixer 101 may be maintained to be in an original state and a probability of deformation may also be reduced. Through this, a life of system may be prolonged.

As such, according to an embodiment of the present invention, it is possible to increase an amount of electrical energy generated through a deformation of the piezoelectric body 105 by applying an additional impact using the repulsion force provider 103 in a process of restoring the fixer 101 on which the piezoelectric body 105 is attached from a deformed state.

Also, since the additional impact may be applied to the fixer 101 on which the piezoelectric body 105 is attached using the repulsion force of the repulsion force provider 103, the number of impacts may increase and the generation rate may also increase.

Hereinafter, a piezoelectric harvesting system using a repulsion force will be described according to a second embodiment of the present invention with reference to FIG. 4.

FIG. 4 is a perspective view illustrating a piezoelectric harvesting system according to the second embodiment of the present invention.

As illustrated in the drawing, in the present embodiment, a piezoelectric harvesting system 200 may allow a repulsion force provider 203 applying an additional impact to a fixer 201 on which a piezoelectric body 205 is attached, to be movable in a horizontal (X-axial and Y-axial) direction. In this example, a moving groove 204H formed in a cross shape may be formed on a connecting plate 204 with which the repulsion force provider 203 is connected. Through this, the repulsion force provider 203 may move in one direction and in a direction perpendicular to the one direction and adjust a position at which a repulsion force is to be provided to the piezoelectric body 201. Hereinafter, a piezoelectric harvesting system using a repulsion force will be described according to a third embodiment of the present invention with reference to FIG. 5.

FIG. 5 illustrates a repulsion force provider moving in a piezoelectric harvesting system according to the third embodiment of the present invention.

As illustrated in the drawing, a repulsion force provider 303 may include a fixing bar 303a and a moving member 303b attached to the fixing bar 303a to be movable in a direction perpendicular to the fixing bar 303a. Here, the moving member 303b may be a portion bumping into the fixer 101 of FIG. 1. By vertically adjusting the position of the moving member 303b, a strength of repulsion force to be applied to a piezoelectric body may be adjusted.

Additionally, the lower position of the moving member 303b, the stronger repulsion force to be applied to the fixer. Conversely, the higher position of the moving member 303b, the weaker repulsion force to be applied to the fixer.

Based on the aforementioned configuration, the position of a moving member relative to a fixing bar may be adjusted to a position at which an amount of generated electrical energy is maximized and damage that may occur in the piezoelectric body 105 of FIG. 1 is minimized.

Hereinafter, a piezoelectric harvesting system using a repulsion force will be described according to a fourth embodiment of the present invention with reference to FIGS. 6 and 7.

FIG. 6 is a perspective view illustrating a piezoelectric harvesting system according to the fourth embodiment of the present invention, and FIG. 7 is a top view of FIG. 6.

As illustrated in the drawings, in the present embodiment, a piezoelectric harvesting system 400 may include a piezoelectric body 405, a fixer 401, a supporter 402, and a single repulsion force provider 403. Here, the repulsion force provider 403 may be configured to mode vertically or horizontally as described with reference to the second embodiment and the third embodiment.

In an example of the present embodiment, the repulsion force provider 403 may be attached to a central portion of the piezoelectric body 401 to evenly provide the repulsion force to the piezoelectric body 401. Also, since the single the repulsion force provider 403 is used in this example, manufacturing costs may also be reduced.

Hereinafter, a piezoelectric harvesting system using a repulsion force will be described according to a fifth embodiment of the present invention with reference to FIG. 8.

FIG. 8 illustrates a piezoelectric harvesting system according to the fifth embodiment of the present invention.

As illustrated in the drawing, dissimilarly to the aforementioned configuration of the piezoelectric body 105 receiving the tensile force in an example of FIG. 2, a piezoelectric harvesting system 500 may be provided in a configuration in which a piezoelectric body 505 is disposed on a lower portion of a fixer 501 to receive a compressive force when an external force is applied and generate an electrical energy through a compression.

In this example, the piezoelectric body 501 may not be stretched and may be contracted by the compressive force and thus, an amount of generated electrical energy may be relatively increased. Also, the amount of generated electrical energy may be more increased through a hitting of a repulsion force provider 503.

As such, according to the embodiments of the present invention, it is possible to obtain electrical energy by secondarily applying an impact to a piezoelectric body using a restoring force of the piezoelectric body in a deformed state.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A piezoelectric harvesting system using a repulsion force, the system comprising:
   a piezoelectric body including a piezoelectric material;
   a fixer having at least one face on which the piezoelectric body is attached;
   a supporter configured to support one side of the fixer; and
   a repulsion force provider configured to allow the piezoelectric body to generate an electrical energy by providing a repulsion force to the fixer in a process of restoring the fixer to an original state after the fixer is deformed by an external force, wherein the repulsion force provider includes:
   a fixing bar provided in a longitudinal direction; and
   a moving member adjustably attached to the fixing bar in the longitudinal direction and configured to adjust a strength of the repulsion force applied to the fixer.

2. The system of claim 1, wherein the repulsion force provider is configured to be in contact with a portion of another face on which the piezoelectric body is not attached.

3. The system of claim 2, wherein when the external force is not applied to the fixer, a height of the portion of the other face corresponds to a height of one end portion of the repulsion force provider.

4. The system of claim 2, wherein a pair of repulsion force providers are provided to provide the repulsion force to symmetrical points of the fixer.

5. The system of claim 1, further comprising:
a connecting plate configured to horizontally adjust a position of the repulsion force provider,
wherein the connecting plate includes a moving groove formed in a cross shape and configured to accept a portion of a lower end of the repulsion force provider such that the repulsion force provider moves in one direction and a direction perpendicular to the one direction.

6. The system of claim 1, wherein the piezoelectric body is attached to a top of the fixer such that a tensile force is exerted on the piezoelectric body when the external force is applied to the fixer in a downward direction.

7. The system of claim 1, wherein the piezoelectric body is attached to a bottom of the fixer such that a compressive force is exerted on the piezoelectric body when the external force is applied to the fixer in a downward direction.

8. A piezoelectric harvesting system using a repulsion force, the system comprising:
a piezoelectric body including a piezoelectric material;
a fixer on which the piezoelectric body is attached;
a supporter configured to support one side of the fixer; and
a repulsion force provider configured to hit the fixer to create an electrical energy in a process of restoring the fixer back to an original state being deformed by an external force, wherein the repulsion force provider includes:
a fixing bar provided in a longitudinal direction; and
a moving member adjustably attached to the fixing bar in the longitudinal direction and configured to adjust a strength of the repulsion force applied to the fixer.

9. The system of claim 8, further comprising:
a hitting member configured to provide the external force based on a flow of a fluid,
wherein the repulsion force provider is configured to hit the fixer being restored to the original state.

10. A piezoelectric harvesting system using a repulsion force, the system comprising:
a piezoelectric body including a piezoelectric material;
a fixer having at least one face on which the piezoelectric body is attached;
a supported configured to support one side of the fixer; and
a repulsion force provider configured to allow the piezoelectric body to generate an electrical energy by providing a repulsion force to the fixer in a process of restoring the fixer to an original state after the fixer is deformed by an external force,
wherein when the external force is not applied to the fixer, a height of the portion of the fixer corresponds to a height of one end portion of the repulsion force provider.

11. The system of claim 10, wherein a pair of repulsion force providers are provided to provide the repulsion force to symmetrical points of the fixer.

12. The system of claim 10, further comprising:
a connecting plate configured to horizontally adjust a position of the repulsion force provider,
wherein the connection plate includes a moving groove formed in a cross shape and configured to accept a portion of a lower end of the repulsion force provider such that the repulsion force provider moves in one direction and a direction perpendicular to the one direction.

13. The system of claim 10, wherein the repulsion force provider includes:
a fixing bar provided in a longitudinal direction; and
a moving member adjustably attached to the fixing bar in the longitudinal direction an configured to adjust a strength of the repulsion force applied to the fixer.

14. The system of claim 10, wherein the piezoelectric body is attached to a top of the fixer such that a tensile force is exerted on the piezoelectric body when the external force is applied to the fixer in a downward direction.

15. The system of claim 10, wherein the piezoelectric body is attached to a bottom of the fixer such that a compressive force is exerted on the piezoelectric body when the external force is applied to the fixer in a downward direction.

* * * * *